US006337991B1

(12) United States Patent
Li et al.

(10) Patent No.: US 6,337,991 B1
(45) Date of Patent: *Jan. 8, 2002

(54) LARGE TEMPERATURE COEFFICIENT OF RESISTANCE MATERIAL

(75) Inventors: Yi-Qun Li, Tewksbury; Jing Zhao, Winchester, both of MA (US)

(73) Assignee: Corning Applied Technologies Corp., Woburn, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/964,520

(22) Filed: Nov. 5, 1997

Related U.S. Application Data

(60) Provisional application No. 60/030,390, filed on Nov. 5, 1996.

(51) Int. Cl.$^7$ ................................................. G01B 7/00
(52) U.S. Cl. ........................................ 505/161; 505/238
(58) Field of Search ........................... 117/947, 84, 99; 428/446; 252/62.51 R, 62.3 T, 519.1; 338/22 R, 25, 22 SD; 505/161, 238, 825, 842, 847

(56) References Cited

U.S. PATENT DOCUMENTS

| 4,076,611 A | * | 2/1978 | Gray ....................... 204/290 F |
| 4,647,895 A | | 3/1987 | Howng ..................... 338/22 R |
| 4,654,622 A | | 3/1987 | Foss et al. .................... 338/14 |
| 4,894,544 A | | 1/1990 | Trunbull ................... 250/338.3 |
| 5,077,270 A | | 12/1991 | Takeda et al. .................. 505/1 |
| 5,128,316 A | * | 7/1992 | Agostinelli et al. ............ 505/1 |
| 5,252,551 A | * | 10/1993 | Wu et al. ....................... 505/1 |
| 5,297,438 A | * | 3/1994 | Alles et al. .................... 73/727 |
| 5,411,814 A | * | 5/1995 | Jin et al. ..................... 428/692 |
| 5,450,053 A | | 9/1995 | Wood .......................... 338/18 |
| 5,487,356 A | * | 1/1996 | Li et al. ........................ 117/99 |
| 5,538,800 A | | 7/1996 | Jin et al. ..................... 428/692 |
| 5,549,977 A | | 8/1996 | Jin et al. ..................... 428/692 |
| 5,563,331 A | * | 10/1996 | Von Helmolt et al. ...... 73/31.05 |
| 5,650,378 A | | 7/1997 | Iijima et al. ................. 505/473 |
| 5,854,587 A | * | 12/1998 | Horowitz et al. ....... 338/22 SD |
| 5,872,080 A | * | 2/1999 | Arendt et al. ............... 505/238 |

OTHER PUBLICATIONS

Lui, J.Z., Chang, I.C., Irons, S., Klavins P., Shelton, R.N., Song, K., Wasserman, S.R., "Giant Magnetoresistance at 300 K in Single Crystals of La 0.65(PbCa)0.35MnO3," Applied Physics Letters, vol. 66 No. 23, % Jun. 1995, pp. 3218–3221.*

* cited by examiner

Primary Examiner—Benjamin L. Utech
Assistant Examiner—Matthew Anderson
(74) Attorney, Agent, or Firm—Hamilton, Brook, Smith & Rehnolds, PC

(57) ABSTRACT

Oxide thin films having a perovskite-like structure and undergoing a ferromagnetic phase transition with large temperature coefficients of resistance (TCRs) are disclosed. These can be useful materials for making thermistors, bolometers, infrared detectors and the like. These can be fabricated with a number of methods, preferably including metal oxide chemical vapor deposition, laser ablation and sputtering. In one embodiment, the oxides are based on a $LaMnO_3$ with substitutions of Ca, Sr, Ba, Mn, and Pb for some of the La. The amounts can be varied to maximize the TCR or shift the temperature at which the maximum occurs. Methods of making such thin films are disclosed. In one embodiment, the high sensitivity films can be used in an array of micro-bolometers in an infrared camera.

12 Claims, 8 Drawing Sheets

LARGE TEMPERATURE COEFFICIENT OF RESISTANCE MATERIAL

RELATED U.S. APPLICATIONS

This application claims priority from a provisional application, Ser. No. 60/030,390, filed Nov. 5, 1996.

STATEMENT OF GOVERNMENTAL INTEREST

The U.S. Government has certain rights in this invention as provided for in Contract No. N00014-96-c2096 awarded by the U.S. Department of the Navy.

BACKGROUND OF THE INVENTION

1. Technical Field

The invention relates to resistor materials that are particularly sensitive to changes in temperature and find use in thermistors, bolometers, infrared detectors and the like.

2. Background of the Invention

In many applications, resistors are preferably made from materials whose resistivity is constant with temperature. However, these always exhibit a change in resistance with temperature. Quite often, this change is sensibly linear and is characterized by a sensibly constant temperature coefficient of resistance (TCR) which is numerically equal to the fractional change in resistance, dR, with change in temperature, dT, and given by $(1/R)(dR/dT)$. (TCR is a more useful characteristic than dR/dT because the absolute resistance can be changed by changing the geometry of the resistor.) For resistor applications, some alloys have TCRs in the parts per million per ° C. range. However, other materials have much higher TCRs and can be used as temperature sensors, commonly called thermistors.

Desirable thermistor materials have constant (for ease of calibration) high (for sensitivity) TCRs over a wide operating temperature and reasonable resistivity values. However, some applications preferably have the highest possible TCR at the sacrifice of constancy and operating range. For example, bolometers detect absorbed radiation by producing an electrical signal in response to their increase in temperature. In a typical application, this increase is minute and constancy over a wide temperature range is unimportant. Bolometers may be optimized by maintaining them at a selected constant average ambient temperature and detecting fluctuations from varying radiation.

FIG. 1 is a chart summarizing the TCR and resistivity of some prior art materials and showing one example of the material of this invention in the upper center. A number of materials, thermistor multi-component oxides and GaAs or GaP based semiconductors in bulk form, have very high TCRs but also very high resistivities. These materials rely upon the excitation of electrons across a large thermal barrier for the high TCR. The large thermal barrier generally results in large resistivities which have the potential for non-ohmic contacts, and large 1/f noise levels. Prior art materials with lower resistances all have lower TCRs. Until now, for use in bolometers, for example, the best choice was $VO_x$ amorphous materials with a typical 0.02/° C. (2%/° C.) TCR.

These problems have received considerable attention for some time, and new materials with a higher TCR are always being sought. Various oxides have been investigated. For example, U.S. Pat. No 4,743,881, issued May 10, 1988 to Howng, discloses La—Cr—O based material, i.e., $LaCrO_3$ with small amounts of Ti, Si, Mg, and/or Al substituted for Cr. This material is capable of operating in the range of 100 to 600° C. These exhibit a TCR of about 2.5%/° C. However, they are bulk devices made by calcining and sintering the oxides.

Materials with compositions similar to that of this invention are known. La—Mn—O based materials, or more precisely $(La_{1-x}A_x)MnO_3$ (A=Ca, Sr, Ba, Cd and Pb; 0<x >1), and La—Co—O analogs were synthesized and extensively studied in early 1950s, see, for instance, G. H. Jonker and J. H. Van Santen, Physica, vol. 16 (1950) pp. 337–349 and pp. 599–600 and Physica, vol. 19 (1953) pp. 120–130. Jonker and Santen measured the ferromagnetic properties and conductivity of sintered powders as a function of temperature and composition. Recently, a great deal of interest was rekindled by the discovery of a "giant magnetoresistive effect" in their thin film forms, see, for example, K. Chahara et al. Appl. Phys. Lett., vol 63 (1993) pp. 1990–1993 (reporting on La—Ca—Mn—O ion beam sputtered films on MgO substrates), R. Von Helmolt et al., Phys. Rev. Lett., vol. 71 (1993) pp.2331–2333 (reporting on La—Ca—Mn—O off-axis laser deposited films on $SrTiO_3$), and S. Jin et al., Science, vol. 264 (1994) pp.413–415 (reporting on La—Ca—Mn—O films on $LaAlO_2$ made via laser ablation of powders).

All these powders and films undergo a magnetic phase transition determined by the composition. Below the transition, they behave as metallic conductors but near the transition, the resistance increases sharply and then falls off almost as sharply above the transition temperature where they behave as semiconductors. In the presence of an external magnetic field, the resistance at all temperatures is reduced. For film materials, this decrease can be greater than a thousand-fold on application of a 6T magnetic field. Jin, et al, postulated that such giant magnetoresistance effects should lead to a variety of technical applications, but their results were obtained with transition temperatures of 77° C. U.S. Pat. No. 5,487,356, issued Jan. 30, 1996 to Li (one of the present inventors) et al., incorporated herein by reference, discloses a metal oxide chemical vapor deposition (MOCVD) method of making giant magnetoresistive material of $(La_{1-x}A_x)MnO_3$ (A=Ca, Sr, Ba, and Mg) with good magnetoresistance effect results at 270 K. However, there are no reports of any investigations of the TCR or use as temperature sensing materials, let alone optimization of the material composition for such use. This may be, in part, because the TCR is highly non-linear and only large within a few degrees of the transition temperature.

Even though it is known that a sharp resistance peak indicates the possibility of a ferromagnetic phase transition, the details are not usually disclosed. An exception is U.S. Pat. No. 5,538,800, issued Jul. 23, 1996 to Li et al., which discloses a polycrystalline material having a very high magnetoresistance ratio of 10,000% in a 6T magnetic field at about 140° K. Although not discussed, the TCR can be deduced from a figure as about 15%/° C., but this is also at about the same low temperature. When making a magnetic field sensor, a high TCR is a disadvantage because the device temperature must be held constant in order to accurately measure the magnetic field effects. A device structure to compensate the TCR was disclosed in U.S. Pat. No. 5,563,331, issued Oct. 8, 1996 to Von Helmolt. Therein, compositions with room temperature TCRs (deduced from figures) in the range of about 2–4%/° C. are illustrated. The invention proposes a method of compensating for the TCR of a magnetoresistive sensor by using two layers of different-composition magnetically sensitive material with a low correlation between their TCRs.

All of these materials are based on a nominal LaMnOz composition with partial substitutions for La and Mn and having a perovskite-like structure. It is known that the perovskite structure is necessary in order to produce a ferromagnetic material. z is nominally 3, but can be in the range of about 2 to 3.5. A decrease from z=3 should occur if, for example, a divalent atom is substituted for the trivalent La. However, there is some uncertainty because some of the Mn atoms, which nominally has a valence of +3, can have a valence of +4 causing an increase in z or a valence of +2 causing a decrease in z. Moreover, there are usually oxygen deficiencies. It is known that in order to exhibit a ferromagnetic effect, there must be some Mn, about 30%, with a +4 valence. For instance, a material with an exact composition LaMnO3 is not ferromagnetic. Since considerable effort is required to determine the exact value of z and the amount of Mn with different valences for each composition, those skilled in the art understand that z has a range of values and often characterize the materials using nominal compositions in conjunction with physical properties.

One application where high a TCR is most useful is in bolometers where high sensitivity is desirable. U.S. Pat. No. 5,450,053, issued Sep. 12, 1995 to Wood, discloses a monolithic integrated focal plane sensitive to both mm-waves (typically 94 GHz) and IR radiation (typically 3–5 and 8–12 micron) constructed on a silicon wafer by selective anisotropic etching to fabricate microbolometer radiation sensors in a linear or two-dimensional array. Each microbolometer is constructed with a thin dielectric plate of amorphous silicon nitride or silicon dioxide attached to the silicon substrate and cantilevered over a groove in the substrate, as illustrated in FIG. 2. Vanadium oxide ($VO_x$) is deposited on the dielectric and a radiation absorbing film deposited on the vanadium oxide. The $VO_x$ material has a TCR in the range of 1–4%/° C. so that when heated by radiation its resistance will change. Since, in this application, the resistance change is very small, for maximum sensitivity, in order to overcome noise, it is desirable that the TCR is as high as possible. It is also desirable that the thermal mass and thermal conductivity to the substrate are as low as possible. These are attempted by using thin films and the cantilever structure. It is further desirable that the absolute resistance is compatible with readout circuitry, e.g., in the range of 100 to 100,000 ohms. Starting with material of reasonable resistivity, this can be obtained by using thin films in a serpentine configuration, if necessary. Another desirable characteristic is that the high TCR occurs near room temperature. However, these bolometers are typically cooled with a thermoelectric cooler so that somewhat lower temperatures, e.g., down to about 250 degrees K, can be used at the expense of some power for the cooler. The citation of this patent is provided as background to show that it is known how to make a microbolometer using thin films of TCR material and is not deemed as prior art to the invention disclosed in this application.

BRIEF SUMMARY OF THE INVENTION

Accordingly, the main object of the invention is to provide materials which have the highest temperature coefficient of resistance (TCR) in a useful range of temperatures, preferably close to room temperature, so that sensitive temperature sensors can be made. A further object is to provide materials which could be produced in the form of a thin film so that sensitive radiation detectors, particularly of the multi-element or mosaic type could be produced. Still more objects are to provide materials which have reasonable resistivities so that practical value resistors can be formed and ones to which it is easy to make electrical contact with metals.

All of these objectives and more have been met with a temperature sensor comprising an oxide having a perovskite-like crystal structure which undergoes a ferromagnetic phase transition. In one embodiment, the oxide has a chemical formula $La_wA_xB_yMnO_z$ where A is a divalent atom selected from an alkaline earth metal, or Mn or Pb, B is a divalent atom selected from an alkaline earth metal, or Mn, or Pb, and w+x+y=1, w, x, and y are in the range of 0 to 1, and z is in the range of 2 to 3.5.

By selecting various combinations of constituents, A and B, in varying amounts, the TCR can be maximized or the temperature at which the maximum TCR occurs can be adjusted. Examples are disclosed having a TCR greater than 5%/° C. at a range of temperatures above −33° C.

In one embodiment, the oxide is produced as an epitaxial thin film on a substrate. A variety of substrates can be used including single crystals whose crystal lattice size is matched to the crystal lattice size of the oxide. Alternately, single crystals with non-matched lattice sizes or even amorphous substrates can be used if suitable buffer layers such as YSZ, $CeO_2$, or YBCO are used. It was discovered that the optimum oxide thin film is biaxially textured with a (100) crystal orientation and that suitable buffer layers promote the growth of such films. It was further discovered that annealing at 900° C. in an oxygen atmosphere promotes oxygen stoichiometry. One sample showed and TCR of 15%/° C. at −20° C. This is the highest TCR known to us near room temperature.

The preferred method of making the invention uses the well known metal oxide chemical vapor deposition (MOCVD) process with suitable precursor chemicals. However, other methods can be used for some of the processing steps. When producing biaxially textured (100) YSZ buffer layers, it is believed that the most suitable method is the ion beam assisted deposition process to produce biaxially oriented single crystals or polycrystals. It is thought that this process would be particularly useful for producing such a film on an amorphous dielectric such as silicon nitride which is used in microbolometers as a an electrically and thermally isolating support structure for existing radiation sensor materials whose resistance changes due to heating by absorbed radiation. After the YSZ layer is formed, the MOCVD process can be used to produce buffer layers and the oxide temperature sensitive material. Using these methods, the films can be easily very thin to produce very low thermal mass sensors. Fortunately, it was found that thin films still had a reasonable resistivity and it was easy to make contacts with pressed metal or evaporated silver.

DETAILED DESCRIPTION OF THE INVENTION

Figure 1:
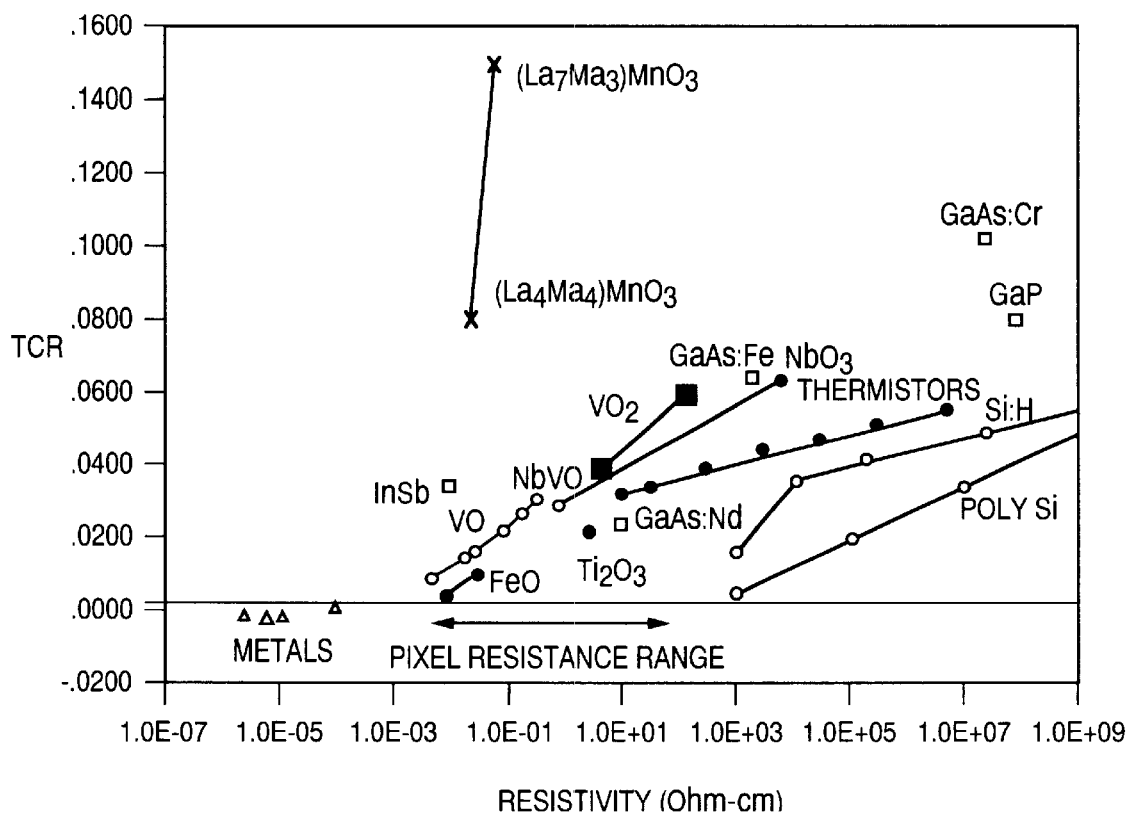
FIG. 1 is a graph of TCR as a function of resistivity for a variety of materials.
Figure 2:
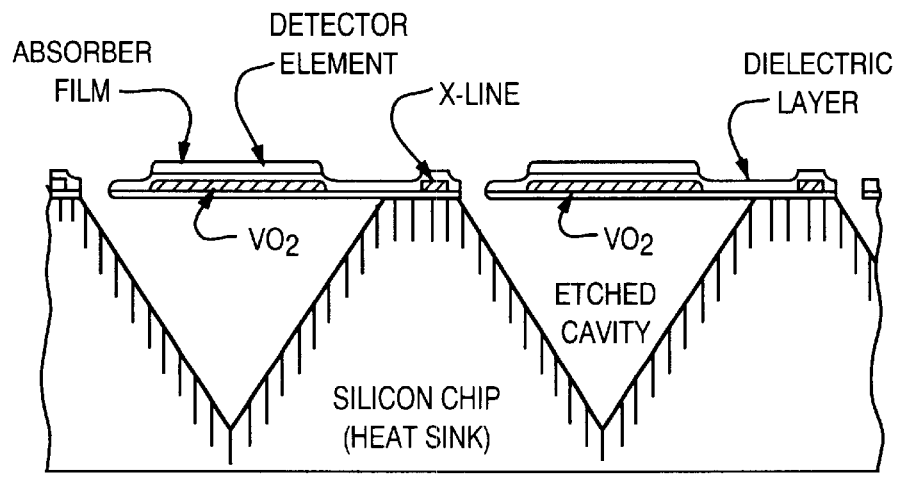
FIG. 2 illustrates a cross section of a multi-element bolometer structure.

During a process of synthesis and characterization of La—Mn—O based thin films as giant magnetoresistive materials, we noted temperature dependant behavior of resistance as shown in FIG. 2. which is similar in shape to that found by previous investigators. However, on calculating the TCR for the zero magnetic field case and comparing this to known thermistor materials, we discovered that our material near its ferromagnetic transition has one of the highest TCRs reported to date. Referring again to FIG. 1, only GaAs:Cr is comparable, but its resistivity is also very high. La—Mn—O based materials have been prepared by a number of methods in the prior art and any of these should produce similar albeit less optimum results. Examples of several different compositions are set out below.

Example 1. When a large area of film is desired, as it would be in commercial production, a preferable lower cost preparation method would use well known MOCVD techniques. In this case, metal P-diketonates, $La(C_{11}H_{19}O_2)$, $Mn(C_{11}H_{19}O_2)$, and $Ca(C_{11}H_{19}O_2)$, can be used as precursors in forming $(La_{1-x}A_x)MnO_3$ (A=Ca and Mn) thin films. The value of x obtained in the films depends on the concentration ratios of the metal precursors, determined experimentally. For instance, a film of nominal composition $(La_{0.4}Mn_{0.6})MnO_3$ was obtained from a single solution prepared by dissolving $La(C_{11}H_{19}O_2)$ and $Mn(C_{11}H_{19}O_2)$ with an atomic ratio of Mn/La=1.5 in n-Butyl acetate solvent. The concentration of the solution was 0.1 mole/l. This solution was injected into a heated vaporizer by a liquid pump, and the vapors were carried immediately into the chamber by argon gas. Oxygen and nitrous oxide are used as oxidizers but air can also be used. The film was deposited on a (100) oriented $LaAlO_3$ substrate under the following conditions:

| | |
|---|---|
| Substrate Temperature | 600 to 700° C. |
| Reactor Pressure | 2 to 4 Torr |
| Oxygen Flow Rate | 300 to 500 sccm |
| Nitrous Oxide Flow Rate | 300 to 500 sccm |
| Argon Flow Rate | 50 to 100 sccm |
| Vaporizer Temperature | 220 to 230° C. |
| Solution Flow Rate | 2 to 10 ml/hr |

The TCR of $(La_{1-x}Mn_x)MnO_3$ samples prepared by MOCVD on a (100) $LaAlO_3$ was measured by a conventional four-probe resistance method. The samples were about 4 mm long by 2 mm wide and 100 nanometers thick.

Two current leads carrying a constant current and two voltage leads were contacted to the sample by a spring loaded mechanism. The sample was successively heated and cooled and the voltage recorded as a function of the temperature as measured by a thermocouple. The results are shown in FIG. 2 for x=0.3, 0.45, and 0.6. (The reasonable resistance value shown results from measuring along the 100 nanometer thin film.)

Figure 3:
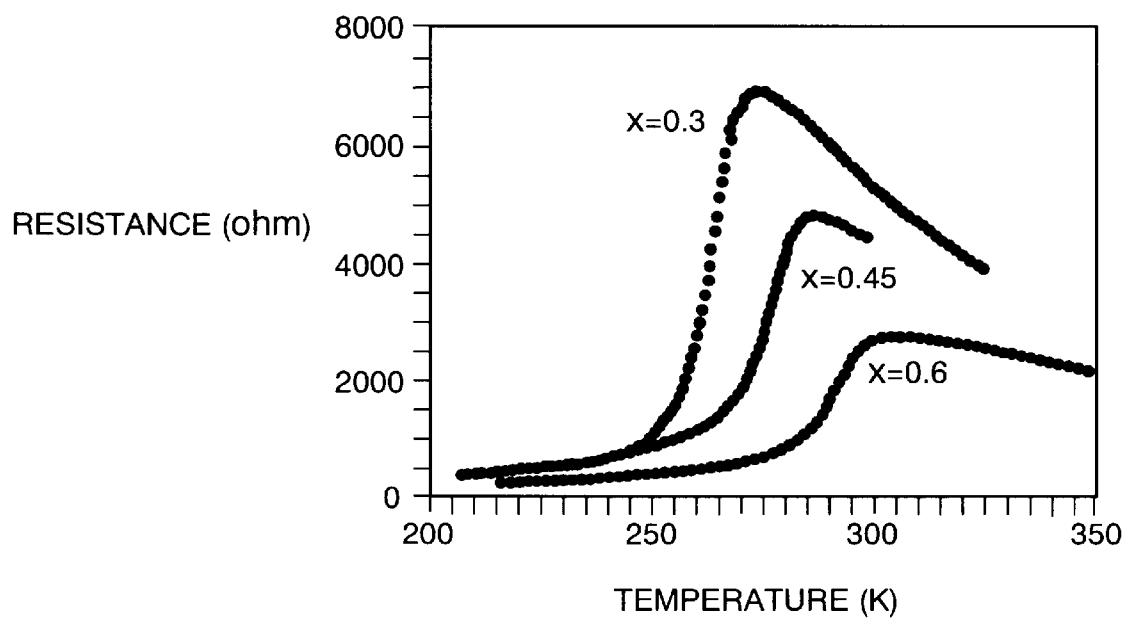
FIG. 3. shows the resistance vs. temperature for $(La_{1-x}Mn_x)MnO_3$ thin films.
Figure 4:
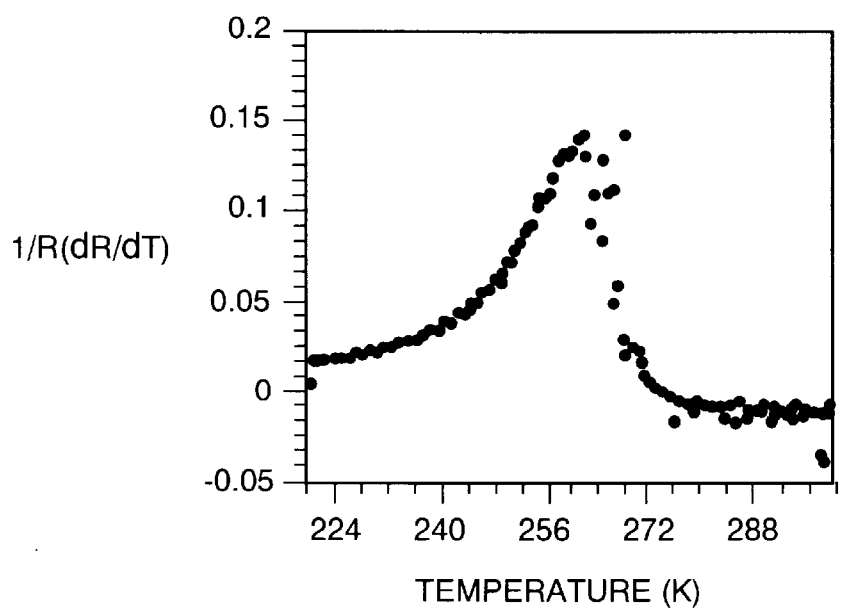
FIG. 4 shows the TCR calculated from FIG. 3 for $(La_{0.7}Mn_{0.3})MnO_3$ as a function of temperature.

FIG. 4 illustrates the TCR characteristics of a $(La_{0.7}Mn_{0.3})MnO_3$ (x=0.3) thin film calculated from the data in FIG. 3. The peak value of TCR was measured as high as 0.15/° C. (TCR=15%/° C. and hereinafter the /° C. will be omitted and understood) at the transition temperature in a comparison with a typical 2%/° C. for the $VO_x$ materials. The resistivity of 0.1 Ω-cm for this film is comparable to the value of the $VO_x$ materials used in bolometers. (Referring again to FIG. 1, the peak TCR is illustrated for values of x ranging from 0.3 to 0.6.)

As shown in FIG. 3, the magnetic transition temperature, which is slightly above the preferred temperature for TCR operation, TCR, and resistivity of $(La_{1-x}A_x)MnO_3$ depend strongly on the substitution concentration x. Moreover, the transition temperature where the peak TCR is obtained can be tailored by making other substitutions using the more general composition $La_wA_xB_yMnO_z$, where A and B are selected from an divalent alkaline earth such as Ca, Sr, Ba, or from Pb or Mn, and w+x+y=1, with x, y, and z are in the range of 0 to 1, and z is nominally 3 but may range from 2 to 3.5. The characteristics of the material are altered whenever x is not equal to 1 because the substituents have a +2 oxidation state versus +3 for La. The ferromagnetic transition temperature is altered by the choice of different substituents, Ca, Sr, Ba, Pb or Mn. Use of Mn alone gave good results and is slightly simpler in production.

Material according to the invention can be in the form of thin films, preferably thin films that are epitaxial with an appropriate substrate, as in this example, but not excluding polycrystalline (textured or untextured) films. It can also be bulk polycrystalline material or single crystal. Exemplary substrate materials, which have a lattice match with $LaMnO_3$ films for epitaxial growth, are $LaAlO_3$, $LaGaO_3$, $SrTiO_3$, $Nd_2GaO_3$, and $Bi_4Ti_3O_{12}$. Non-lattice matched substrates such as YSZ, MgO, $Al_2O_3$, r-plane sapphire, semiconductors such as Si, amorphous dielectrics such as silicon nitride or silicon dioxide, or even appropriate metals or metal alloys can also be used. These generally require the use of a lattice matching buffer layer such as yttrium stabilized zirconia (YSZ), yttrium barium copper oxide (YBCO), $Bi_4Ti_3O_{12}$ or $SrTiO_3$ to promote epitaxial growth. Such a buffer layer can also provide electrical insulation between the film if a conductive substrate is contemplated.

Thin films of material according to the invention can be formed by any suitable physical or chemical deposition technique, e.g., sputtering, laser ablation, evaporation, molecular beam epitaxy, chemical vapor deposition, electroplating, electroless plating, plasma spray deposition, and sole-gel spin or dip coating, typically followed by an oxidation step. Chemical vapor deposition (in particular MOCVD), laser ablation and sputtering are the currently preferred deposition techniques. Additional examples illustrate some of these variations.

Example 2. Two films with nominal composition $(La_{0.7}Pb_{0.3})MnO_3$ and $(La_{0.7}Ca_{0.3})MnO_3$ were deposited on (100) $LaAlO_3$ substrates with an MOCVD system under the deposition condition listed in Example 1. The resulting layers were epitaxial with the substrates. The resistivity of both layers as a function of temperature was measured by a conventional four-probe method. The $(La_{0.7}Pb_{0.3})MnO_3$ layer showed a broad magnetic transition with a peak resistance temperature of about 350° K. The TCR of the layer peaked at 295° K, but was a relatively low 1.7%/° C. In contrast, the $(La_{0.7}Ca_{0.3})MnO_3$ layer showed a sharp magnetic transition with a peak temperature of about 260° K. The TCR of the layer was a high 15%/° C. at 240° K.

Figure 5:
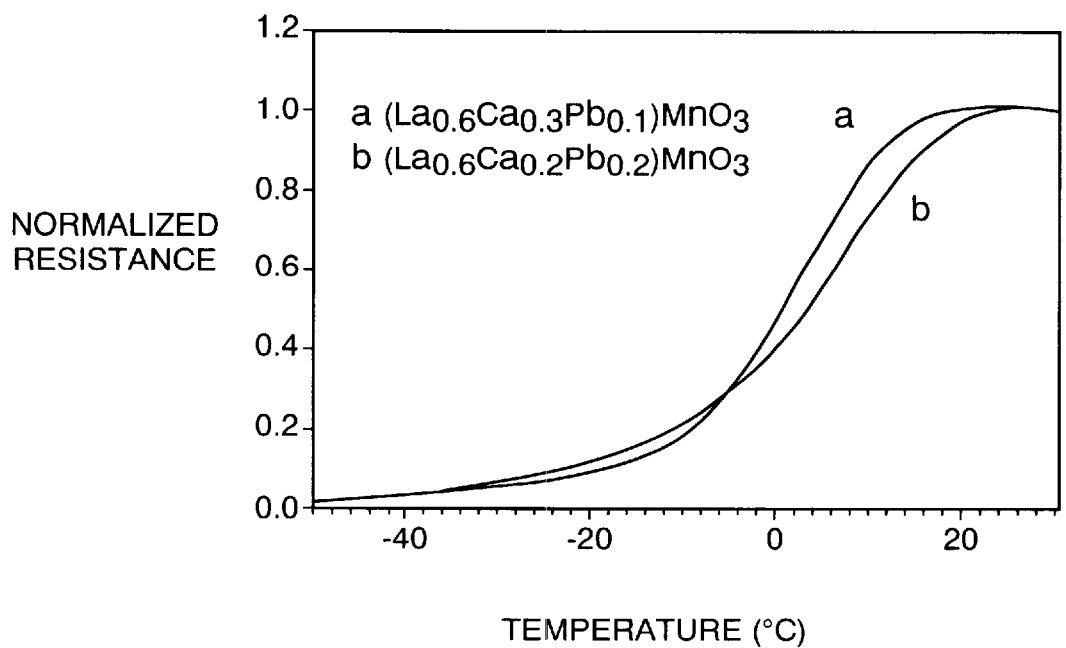
FIG. 5 shows the resistance vs. temperature for $(La_{0.6}Ca_{0.3}Pb_{0.1})MnO_3$ and $(La_{0.6}Ca_{0.2}Pb_{0.2})MnO_3$

Example 3. A combination of calcium and lead in substitution for lanthanum showed a trade-off between transition temperature and the TCR characteristic. FIG. 5 shows the resistance as a function of temperature for $(La_{0.6}Ca_{0.3}Pb_{0.1})MnO_3$ and $(La_{0.6}Ca_{0.2}Pb_{0.2})MnO3$ layers deposited on (100) $LaAlO_3$ substrates by MOCVD under the deposition conditions as listed in Example 1. The film with a composition $(La_{0.6}Ca_{0.3}Pb_{0.1})MnO_3$ had a TCR=12%/° C. at 263° K, 10%/° C. at 273° K, and 7%/° C. at 278° K while the film with a composition $(La_{0.6}Ca_{0.2}Pb_{0.2})MnO_3$ had a TCR= 5.6%/° C. at 263° K, 6.4%/° C. at 273° K and 6%/° C. at 278° K.

Figure 6A:
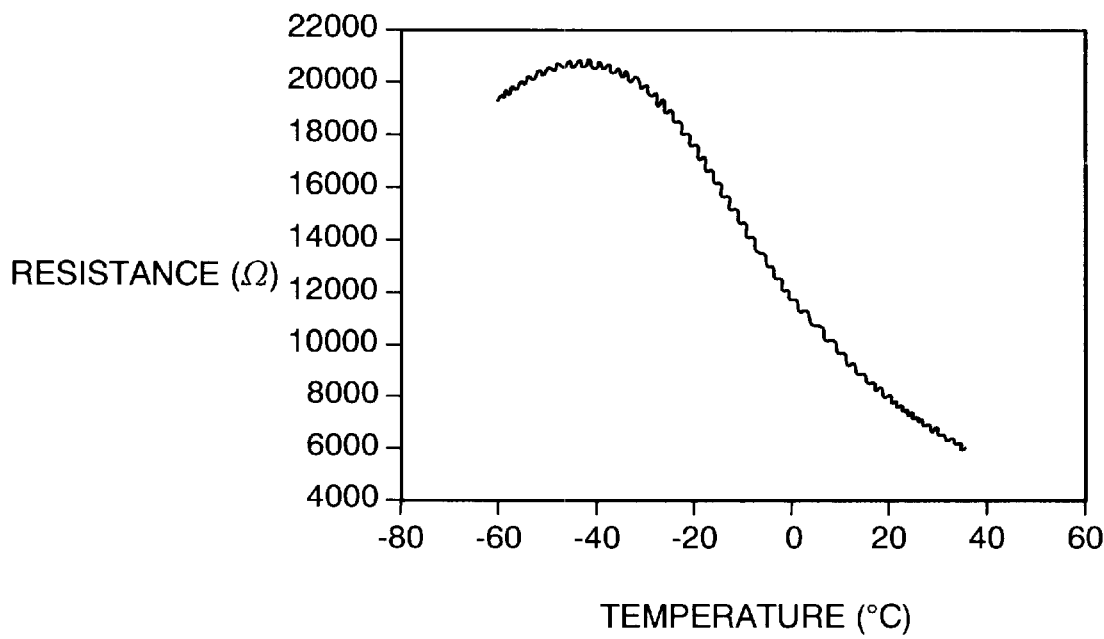
FIGS. 6A and 6B show the θ-2θ x-ray diffraction and resistance vs. temperature measurements for $(La_{0.6}Ca_{0.3}Pb_{0.1})MnO_3$ deposited directly on YSZ.
Figure 6B:
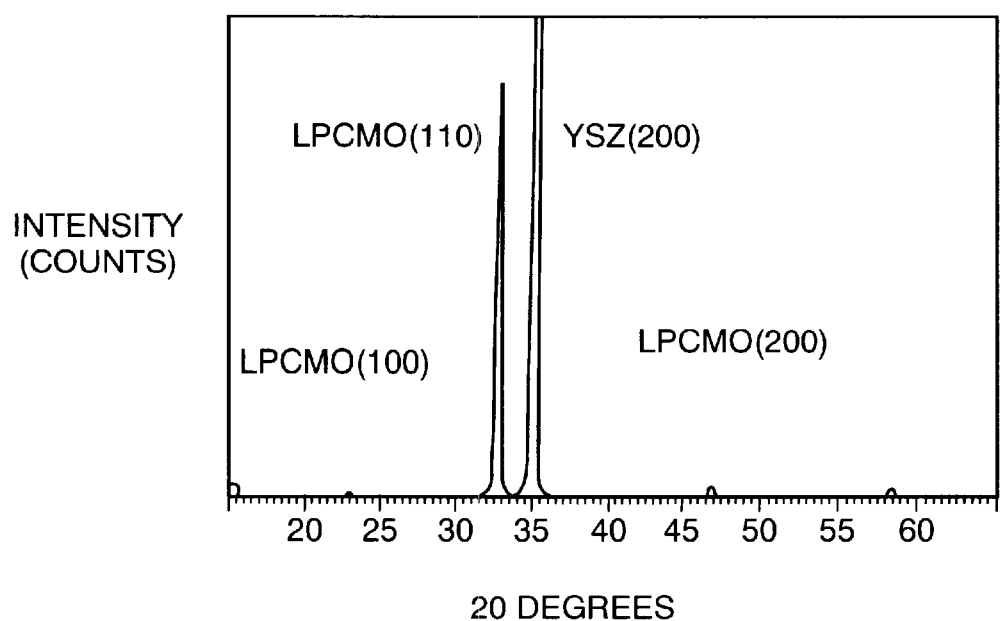
Figure 7A:
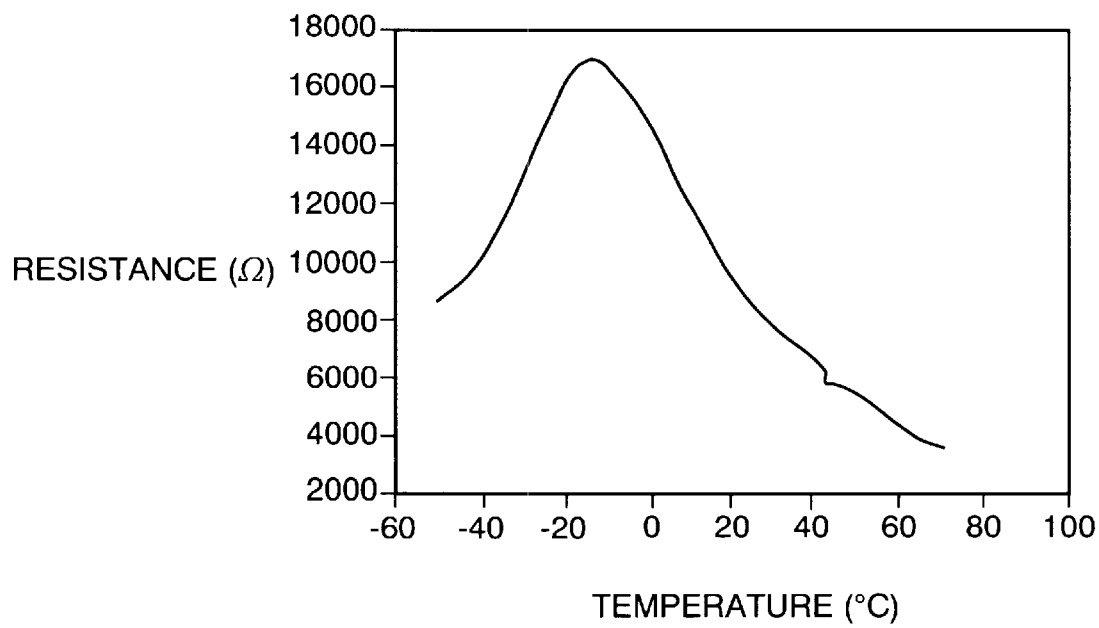
FIGS. 7A and 7B show the θ-2θ x-ray diffraction and resistance vs. temperature measurements for $(La_{0.6}Ca_{0.3}Pb_{0.1})MnO_3$ deposited on a $CeO_2$ buffer layer on YSZ
Figure 7B:
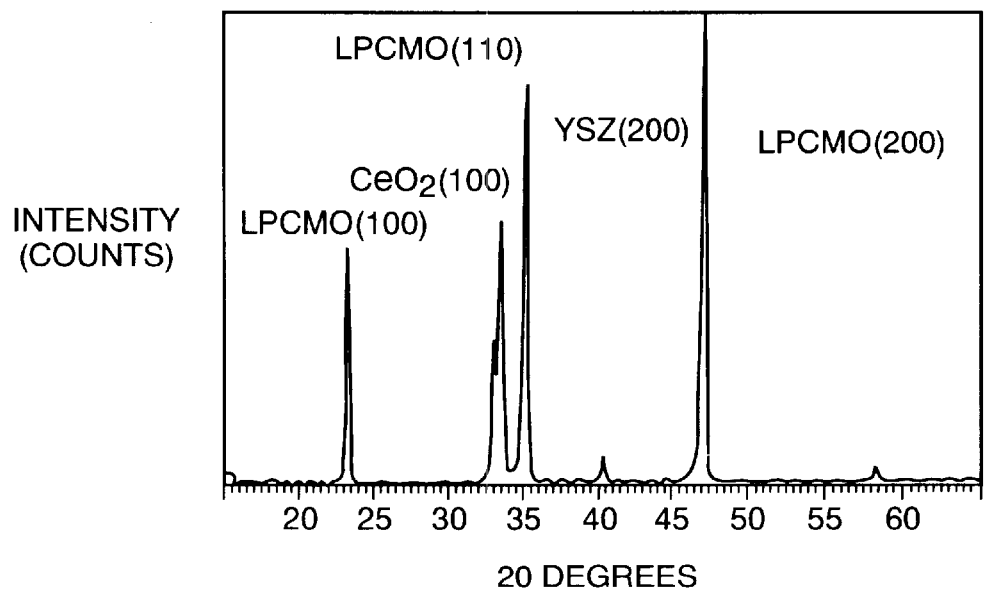
Figure 8A:
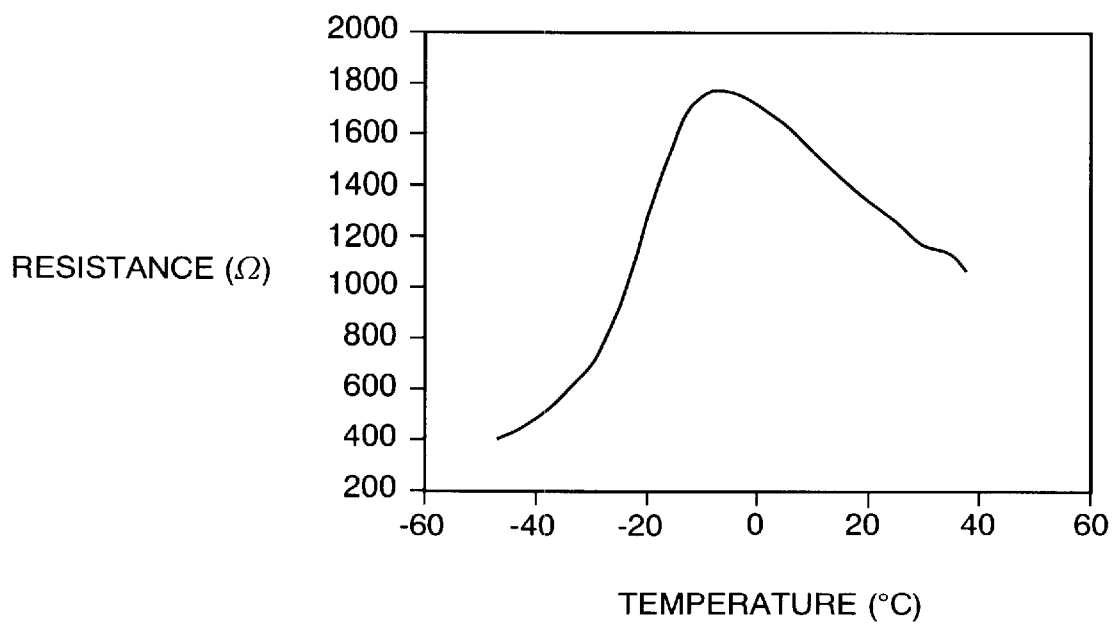
FIGS. 8A and 8B show the θ-2θ x-ray diffraction and resistance vs. temperature measurements for $(La_{0.6}Ca_{0.3}Pb_{0.1})MnO_3$ deposited on a YBCO buffer layer on YSZ.
Figure 8B:
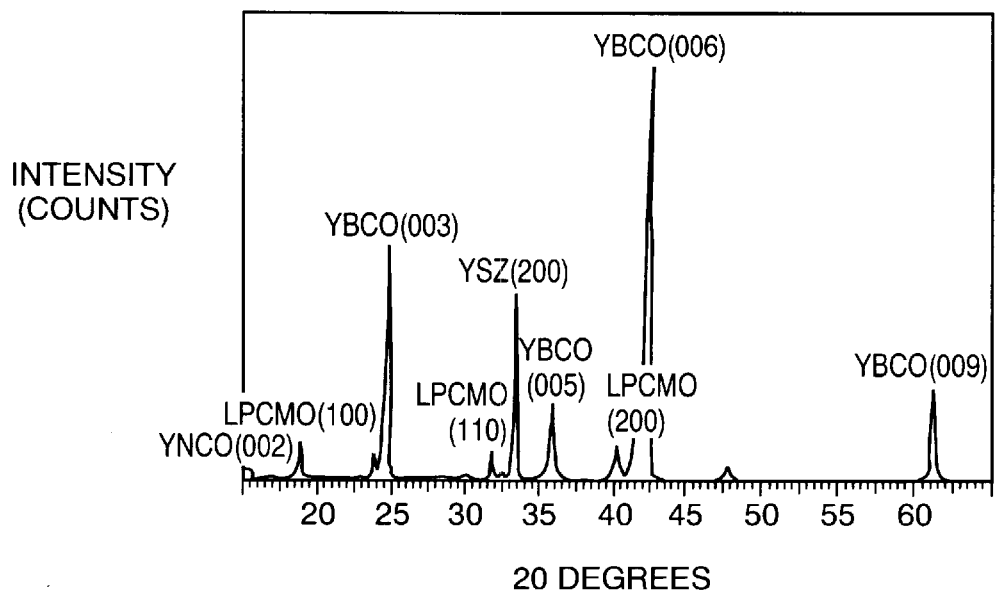
Figure 9A:
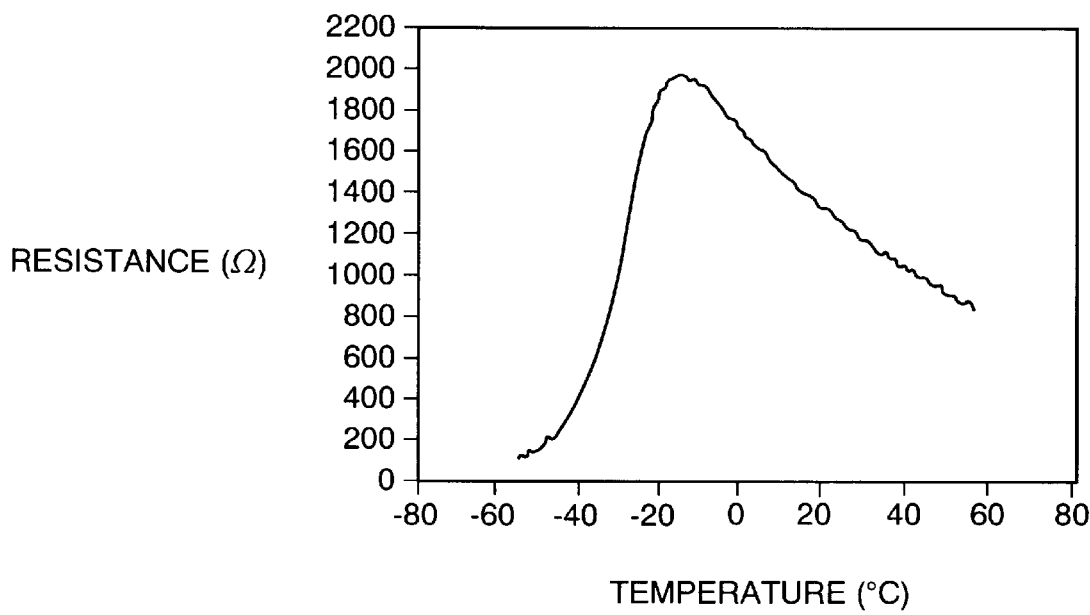
FIGS. 9A and 9B show the θ-2θ x-ray diffraction and resistance vs. temperature measurements for $(La_{0.6}Ca_{0.3}Pb_{0.1})MnO_3$ deposited on a YBCO buffer layer on a $CeO_2$ buffer layer on YSZ.
Figure 9B:
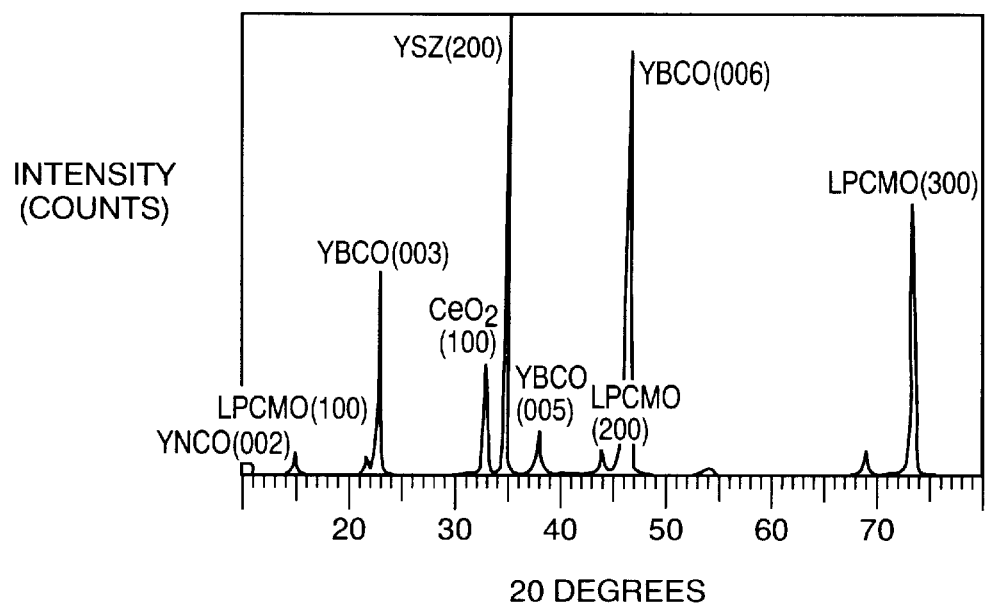

Example 4. Single crystal substrates of (100) yttrium stabilized zirconia (YSZ) were provided. $(La_{0.6}Ca_{0.3}Pb_{0.1})MnO_3$ films were deposited on bare YSZ, $CeO_2$ buffered YSZ, $Yba_2Cu3O_7$ (YBCO) deposited on $CeO_2$ buffered YSZ, and YBCO buffered YSZ substrates under the same deposition conditions listed in Example 1. Both the YBCO and $CeO_2$ layers were also deposited in the same CVD chamber and under the same conditions listed in Example 1 used for deposition of the $(La_{0.6}Ca_{0.3}Pb_{0.1})MnO_3$ films. 2% cobalt was doped into the YBCO layer to increase its resistivity. FIGS. 6A and 6B (wherein $(La_{0.6}Ca_{0.3}Pb_{0.1})MnO_3$ is designated by LPCMO) show that the film directly deposited on the YSZ substrate was (110) oriented and had a very broad magnetic phase transition at 223° K and thus a low TCR characteristic. However, the film deposited on the $CeO_2$ buffer layer on YSZ has a mixed orientation of (100) and (110) and a much improved TCR at 223° K as shown in FIGS. 7A and 7B. FIGS. 8A, 8B, 9A, and 9B show that the films deposited on YBCO buffer layers, with or without an intermediate $CeO_2$ buffer on the YSZ substrate, have a dominant (100) orientation, the same as that of the film deposited on (100) $LaAlO_3$ substrate. About a 10%/° C. TCR was measured at 240° K on the film deposited on the YBCO buffered YSZ substrates. Thus, it may be concluded that a preferred orientation for the TCR film is (100). That is, the c-axis should be normal to the plane of the film.

Figure 10:
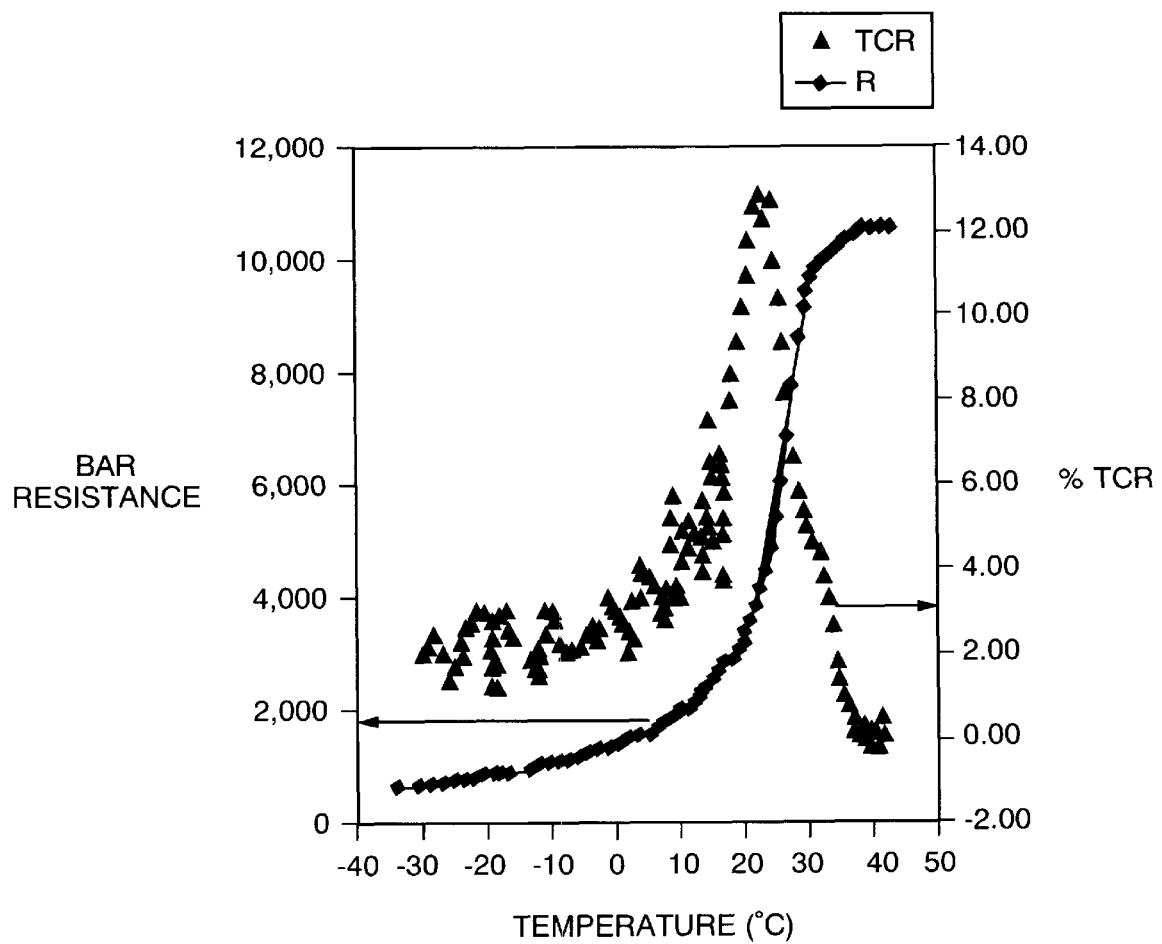
FIG. 10 shows resistance and TCR vs. temperature $(La_{0.6}Ca_{0.2}Mn_{0.2})MnO_3$ thin film deposited on (100) $LaAlO_3$ substrate after annealing in oxygen for 3 hours at 900° C.

Example 5. The same process as was described in Examples 3 & 4 can be used with other material systems including $(La_{0.6}Ca_{0.3}B_{0.1})MnO_3$ where B is Sr, Ba, and Mn. A TCR of about 10%/° C. was also achieved at 273° K for these three composition thin films deposited on single crystal (100) $LaAlO_3$ substrates by the MOCVD method described in Example 1. It was found that one can trade off a higher maximum value of the TCR at a lower temperature for a lower maximum value at a higher temperature by varying the ratio of Ca to B. Ca alone produced the highest TCR but at lower temperatures. We found that the addition of any of Pb, Sr, Mn, or Ba lowered the TCR but raised the temperature where it was maximum in proportion to the ratio of Ca to B. We also found that the stoichiometry of oxygen in these lanthanum magnates was an important factor in determining the TCR properties. For example, a $(La_{0.6}Ca_{0.2}Mn_{0.2})MnO_3$ thin film deposited on (100) $LaAlO_3$ substrate had, as deposited, a TCR=15%/° C. at 273° K. However, after annealing in an oxygen atmosphere at 900° C. for 3 hours, the TCR and temperature maximum changed to 13%/° C. at 295° K as shown in FIG. 10.

Prophetic Example. For a bolometer application, as disclosed by Wood wherein an amorphous silicon nitride dielectric cantilever is attached to a silicon substrate, an additional processing step is required. First, in order to promote growth of the TCR material with a preferred (100) orientation, a biaxially textured YSZ layer should be deposited. A suitable method is disclosed in U.S. Pat. No. 5,650, 378, issued Jul. 22, 1997 to Iijima et al., incorporated herein by reference. This is a method of using ion beams to assist in a sputter deposition from a target plate of the selected material, in this case YSZ, onto a substrate. By providing an ion beam angle of incidence to the substrate in the range of 40–60 degrees, the YSZ film will grow with a (100) orientation and, moreover, even though polycrystalline, the a and b axis of the polycrystals will be aligned to each other within 30 degrees or less. Although the cited patent used polished nickel as a substrate, others have reported using essentially the same technique to produce biaxially textured YSZ with a (100) orientation on pyrex glass, N. Sonnenberg et al., J. Appl. Phys., vol. 74, no. 2, (1993) pp. 1027–1034, incorporated herein by reference. Thus, the process should work for a variety of other materials. Once this YSZ layer has been formed, the processes in example 4 which were used with a YSZ single crystal substrates can be used. In this way, a structure consisting of a silicon nitride layer, a YSZ layer, a $CeO_2$ layer, a relatively non-conducting YBCO layer, and a TCR layer can be fabricated. In Example 4, including the $CeO_2$ layer gave slightly better results than without, but is not essential.

While use in a bolometer may be a preferred embodiment, the inventive material may be useful as a thermistor in other situations where the temperature range is restricted, for example, as a human body temperature thermometer, as a temperature limit detector, in anenometers, and the like. Unlike other thermistors materials which use bulk construction, the inventive material is preferably in the form of a film spiral on a tubular substrate, a serpentine film on a planar substrate or like structure as are well known in the art. Little difficulty was found in make good ohmic contacts with pressed metal contacts or evaporated silver so construction should be straightforward. The inventive material is also particularly suited to integrated circuit temperature sensors which provide sensing and amplification on the same chip.

Other embodiments of the invention will be apparent to those skilled in the art from the disclosure in this application. It is intended that the examples and specification be considered exemplary only; the true scope and spirit of the invention being indicated by the following claims.

What is claimed is:

1. A temperature sensor structure comprising a single crystal substrate;
    a buffer layer comprising $CeO_2$ deposited over the substrate and YBCO deposited over the $CeO_2$ buffer layer; and
    an epitaxial thin film of an oxide material having a perovskite-like structure which undergoes a ferromagnetic phase transition.

2. The structure of claim 1 wherein the substrate is selected from a single crystal which is lattice matched to the oxide material.

3. The structure of claim 2 wherein the single crystal is (100) oriented lanthanum aluminate.

4. The structure of claim 1 wherein the substrate is a single crystal which is not lattice matched to the oxide material.

5. The structure of claim 4 wherein the buffer layers comprise $CeO_2$ deposited on the substrate and further comprises YBCO deposited on the $CeO_2$ buffer layer.

6. The temperature sensor of claim 1 wherein the oxide material is further characterized by having a temperature coefficient of resistance greater than about 8% at temperatures greater than about 270° K.

7. A bolometer having a substrate comprising a silicon nitride layer;

a biaxially textured YSZ buffer layer deposited on said silicon nitride layer;

a YBCO buffer layer deposited on said YSZ buffer layer; and a temperature sensing layer deposited thereon, said temperature sensing layer comprising an oxide material having a perovskite structure that undergoes a ferromagnetic phase transition.

8. The bolometer claim 7 additionally comprising a $CeO_2$ buffer layer deposited on said biaxially textured YSZ layer and interposed between said YSZ layer and said YBCO layer.

9. The bolometer of claim 7 wherein the oxide material has the chemical formula $La_wA_xB_yMnO_z$ where A is a divalent atom selected from an alkaline earth metal, or Mn or Pb, B is a divalent atom selected from an alkaline earth metal, or Mn, or Pb, and where w+x+y=1, w, x and y are in the range of 0 to 1, and z is in the range of 2–3.5.

10. The bolometer of claim 9 wherein A is Ca, B is Pb, w is about 0.6 and x ranges from about 0.2 to about 0.3.

11. The bolometer of claim 7 wherein:

the substrate comprises:

a silicon nitride layer;

a biaxially textured YSZ buffer layer deposited on said silicon nitride layer;

a $CeO_2$ buffer layer deposited on said biaxially textured YSZ layer;

a YBCO buffer layer deposited on said $CeO_2$ buffer layer; and the oxide material has the chemical formula $La_wCa_xPb_yMnO_z$ where w is about 0.6 and x ranges from about 0.2 to about 0.3.

12. The bolometer of claim 7 wherein the oxide material is further characterized by having a temperature coefficient of resistance greater than about 8% at temperatures greater than about 270° K.

* * * * *